(12) United States Patent
Lahreche

(10) Patent No.: US 8,283,673 B2
(45) Date of Patent: Oct. 9, 2012

(54) METHOD FOR MANUFACTURING A LAYER OF GALLIUM NITRIDE OR GALLIUM AND ALUMINUM NITRIDE

(75) Inventor: Hacene Lahreche, Paris (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/313,522

(22) Filed: Dec. 7, 2011

(65) Prior Publication Data

US 2012/0074427 A1  Mar. 29, 2012

Related U.S. Application Data

(62) Division of application No. 12/934,359, filed as application No. PCT/EP2009/052881 on Mar. 11, 2009, now Pat. No. 8,093,077.

(30) Foreign Application Priority Data

Mar. 25, 2008 (FR) ...................................... 08 51891

(51) Int. Cl.
*H01L 29/15* (2006.01)
(52) U.S. Cl. ............ 257/76; 257/98; 257/101; 257/103; 257/192; 257/194
(58) Field of Classification Search .................... None
See application file for complete search history.

(56) References Cited

U.S. PATENT DOCUMENTS

| 7,273,664 | B2 | 9/2007 | Semond et al. | 428/698 |
|---|---|---|---|---|
| 2003/0057434 | A1* | 3/2003 | Hata et al. | 257/103 |
| 2005/0118752 | A1 | 6/2005 | Otsuka et al. | 438/172 |
| 2005/0263791 | A1 | 12/2005 | Yanagihara et al. | 257/194 |
| 2006/0017073 | A1 | 1/2006 | Hata et al. | 257/222 |
| 2008/0217645 | A1 | 9/2008 | Saxler et al. | 257/101 |

FOREIGN PATENT DOCUMENTS

| GB | 2 343 294 A | 5/2000 |
|---|---|---|
| GB | 2 350 721 A | 12/2000 |
| WO | WO 01/95380 A1 | 12/2001 |
| WO | WO 2008/112096 A2 | 9/2008 |

OTHER PUBLICATIONS

International Search Report, application No. PCT/EP2009/052881, mailed May 12, 2009.

* cited by examiner

*Primary Examiner* — Kyoung Lee
(74) *Attorney, Agent, or Firm* — Winston & Strawn LLP

(57) ABSTRACT

The present invention relates to a crack-free monocrystalline nitride layer having the composition $Al_xGa_{1-x}N$, where $0 \leq x \leq 0.3$, and a substrate that is likely to generate tensile stress in the nitride layer. The structure successively includes the substrate; a nucleation layer; a monocrystalline intermediate layer having a selected thickness on the nucleation layer; a monocrystalline seed layer of an AlBN compound in which the boron content is between 0 and 10% having a selected thickness on the intermediate layer and a relaxation rate, at ambient temperature, of less than 80%; and the monocrystalline nitride layer.

15 Claims, 2 Drawing Sheets

METHOD FOR MANUFACTURING A LAYER OF GALLIUM NITRIDE OR GALLIUM AND ALUMINUM NITRIDE

CROSS-REFERENCE TO RELATED APPLICATIONS

This application is a division of application Ser. No. 12/934,359 filed Sep. 24, 2010, now U.S. Pat. No. 8,093,077, which is a 371 filing of International Patent Application PCT/EP2009/052881 filed Mar. 11, 2009.

FIELD OF THE INVENTION

This invention is placed in the field of forming monocrystalline layers of nitride with a composition of $Al_xGa_{1-x}N$, where x is between 0 and 0.3, that are flat and crack-free, on substrates likely to generate tensile stress in the layer of nitride.

These structures are then used in electronics, optics, optoelectronics or photovoltaic applications to form photovoltaic components, electroluminescent diodes, Schottky diodes, lasers, optical detectors, MEMS ("Micro-Electro-Mechanical System"), rectifiers and field effect transistors such as HEMT ("High Electron Mobility Transistor") or MOS ("Metal-Oxide-Semiconductor Transistor) transistors.

BACKGROUND OF THE INVENTION

Gallium nitride (GaN) homoepitaxy is not achievable to date due to the absence of native GaN substrates. Therefore, it is necessary to resort to heteroepitaxy, that is, growth on a substrate of a different nature, to grow GaN layers.

For this purpose, substrates such as silicon or silicon carbide are particularly appreciable due to their slight difference in lattice parameter with GaN.

However, such substrates present the disadvantage of presenting a coefficient of thermal expansion (CTE) that is substantially less than that of gallium nitride, such that, during cooling after the epitaxy, tensile stresses are generated in the gallium nitride layer.

The thicker the gallium nitride layer, the larger the stresses. When the stresses exceed a certain threshold, the material tends to relax by forming cracks.

Cracks are macroscopic damages in the layer, i.e., discontinuities that appear at the surface of the layer, making it unusable for manufacturing electronic devices.

A method for manufacturing a crack-free gallium nitride monocrystalline layer, on a substrate likely to generate tensile stresses in the layer is known from WO 01/95380.

With reference to FIG. 1, this method consists of successively forming on a substrate 10:
a nucleation layer 20 or buffer layer
a first layer 30 of GaN
a monocrystalline intermediate layer 40 in a material whose lattice parameter is smaller than that of gallium nitride, and presenting a thickness of between 100 and 300 nm
the thick layer 50 of GaN.

The function of the intermediate layer 40 is to be a seed layer for the growth of gallium nitride. Gallium nitride in fact conforms to the lattice parameter of the material of the layer on which it is formed.

Because of its lower lattice parameter, the intermediate layer 40 imposes, at the deposition temperature, a compressive stress in the overlying gallium nitride layer 50.

This compressive stress offsets the tensile stress generated in the GaN during cooling, due to the difference in thermal expansion coefficient between GaN and the substrate.

According to the prior art, the intermediate layer 40 must present good crystalline quality to enable the epitaxy of a good quality and stressed GaN layer. So that the GaN does not relax at the interface, it is important in fact that the interface between the intermediate layer and the layer of GaN is completely flat.

This method thus enables layers whose thickness may reach approximately 3 µm to date to be manufactured on a silicon substrate.

However, the thickness by which the GaN may grow remains limited since during growth, it partially relaxes by forming dislocations. Beyond a certain thickness, the layer of GaN is thus again in tension and is likely to crack during cooling.

One embodiment of the invention thus enables the formation of gallium nitride layers that are even thicker than those achievable in the prior art. Typically, one seeks to obtain layers with a thickness greater than 2 µm, that may reach 7 µm or more without cracking and preferably with a level of dislocation of less than $5 \cdot 10^9$ cm$^{-2}$.

In addition, the more the layer thickness increases, the more a concave curvature in the upper surface of the structure is observed. The tension stress in the GaN layer in fact induces a concave deformation in the silicon substrate. This phenomenon is all the more appreciable the larger the wafer diameter. Now, this lack of flatness is a problem that may turn out to be insurmountable for subsequent technological processes when making electronic or optoelectronic components.

Thus, another embodiment of the invention is to improve the flatness of the thick layer of gallium nitride formed.

SUMMARY OF THE INVENTION

In conformance with the invention, a method of manufacturing a crack-free monocrystalline nitride layer with the composition $Al_xGa_{1-x}N$ is proposed, where $0 \leq x \leq 0.3$, on a substrate likely to generate tensile stresses in the layer, said method comprising the following steps:
a) formation, on the substrate, of a nucleation layer
b) formation, on the nucleation layer, of a monocrystalline intermediate layer
c) formation, on the intermediate layer, of a monocrystalline seed layer
d) formation, on the seed layer, of the monocrystalline layer of $Al_xGa_{1-x}N$ nitride.
This method is characterized in that:
the intermediate layer material is aluminum and gallium nitride;
the seed layer material is an AlBN compound in which the boron content is between 0 and 10%;
the ratio between the thickness of the seed layer and the thickness of the intermediate layer is between 0.05 and 1;
the temperature of forming the seed layer is 50 to 150° C. higher than the temperature of forming said crack-free monocrystalline $Al_xGa_{1-x}N$ nitride layer.

The thickness of the crack-free monocrystalline $Al_xGa_{1-x}N$ nitride layer may thus be between 800 nm and 7 micrometers.

According to other particularly advantageous characteristics of the invention:
the thickness of the intermediate layer is equal to or greater than 250 nm;

the intermediate layer presents a content of aluminum of between 1 and 35%, preferably between 6% and 30%;

the substrate is in silicon, diamond or silicon carbide;

the ratio between the thickness of the seed layer and the thickness of the intermediate layer is between 0.2 and 0.35;

the thickness of the seed layer is between 30 and 250 nm;

the temperature of forming the seed layer by molecular beam epitaxy is 80° C. higher than the temperature of forming the crack-free monocrystalline nitride layer.

Another embodiment of the invention relates to a structure comprising a crack-free monocrystalline nitride layer with the composition of $Al_xGa_{1-x}N$, where $0 \leq x \leq 0.3$, and a substrate likely to generate in the layer tensile stresses, said structure successively comprising:

said substrate;

a nucleation layer;

a monocrystalline intermediate layer;

a monocrystalline seed layer;

said monocrystalline layer of nitride,

This structure is characterized in that:

the seed layer is an AlBN compound, in which the boron content is between 0 and 10%;

the seed layer presents a relaxation rate, at ambient temperature, of less than 80%.

The thickness of the crack-free monocrystalline $Al_xGa_{1-x}N$ nitride layer, may then be between 800 nm and 7 micrometers.

According to other preferred characteristics of the invention:

the intermediate layer is in aluminum and gallium nitride and presents an aluminum content of between 1 and 35%, preferably between 6 and 30%;

the ratio between the thickness of the seed layer and the thickness of the intermediate layer is between 0.05 and 1, preferably between 0.2 and 0.35;

the thickness of the intermediate layer is equal to or greater than 250 nm;

the thickness of the seed layer is between 30 and 250 nm;

the substrate is in silicon, diamond or silicon carbide;

the relaxation rate at ambient temperature of the seed layer is between 50 and 75%.

According to a particular embodiment, the crack-free monocrystalline nitride layer comprises 3 to 5% of aluminum and said structure successively comprises on said layer:

a channel layer in GaN with a thickness of 5 to 100 nm, and a barrier layer in a material chosen from among AlGaN, AlInN and BGaN.

According to another embodiment of the invention, said structure successively comprises, on the crack-free monocrystalline nitride layer:

a channel layer of ScN, and a barrier layer in a material chosen from among AlGaN, AlInN and BGaN.

According to another variation, the crack-free monocrystalline layer is in gallium nitride and said structure comprises, on said layer, a barrier layer in a material chosen from among AlGaN, AlInN and BGaN.

The invention also relates to a device such as a photovoltaic component, an electroluminescent diode, a Schottky diode, a laser, an optical detector or an MEMS, comprising the structure that has just been described.

Lastly, the invention also applies to a field effect transistor that comprises the structure described above.

BRIEF DESCRIPTION OF THE DRAWINGS

Other characteristics and advantages of the invention will emerge from the following detailed description, with reference to the attached drawings in which.

DETAILED DESCRIPTION OF THE INVENTION

Figure 1:
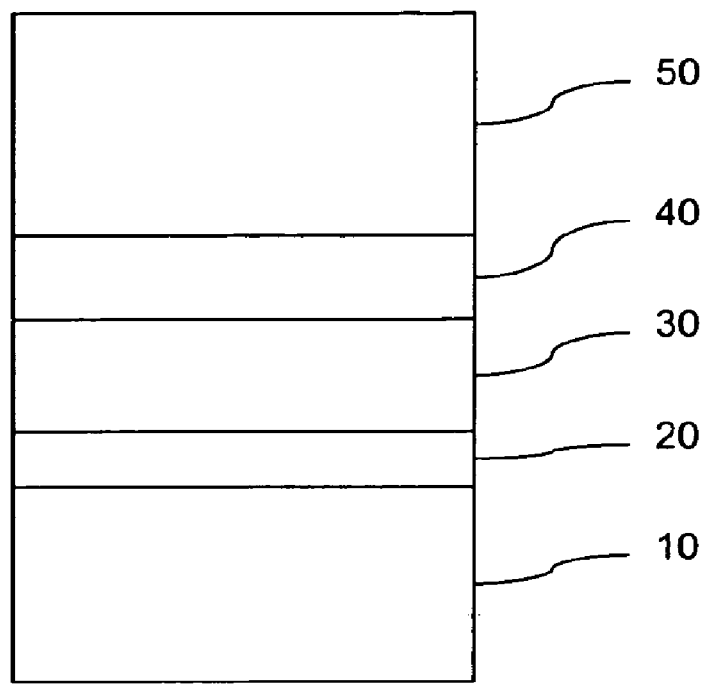
FIG. 1 shows a structure comprising a crack-free layer of gallium nitride in conformance with the prior art, FIG. 2 schematically illustrates a structure in conformance with the invention.
Figure 2:
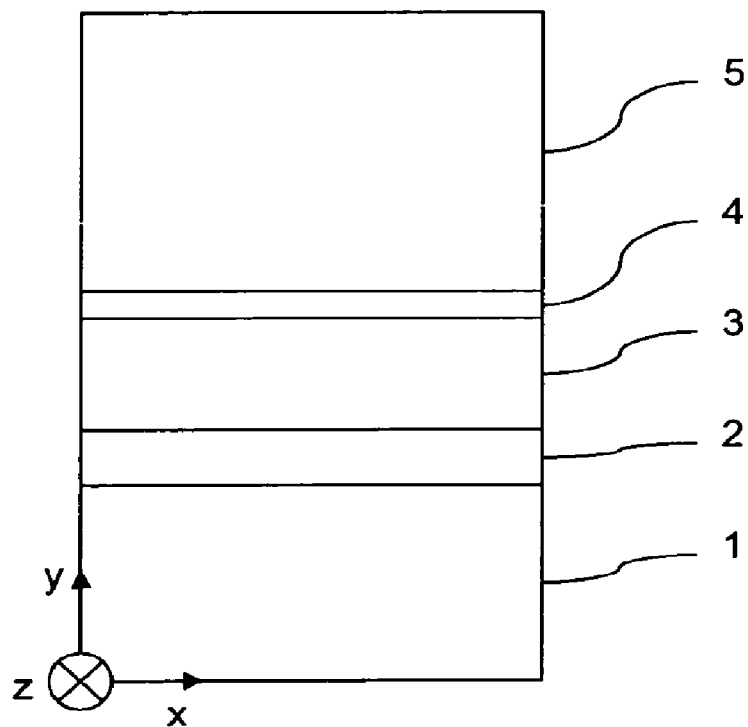

The method of manufacturing a structure comprising a crack-free monocrystalline layer of gallium nitride on a substrate likely to generate tensile stresses will now be described in detail.

The steps for forming different monocrystalline layers constituting this structure are implemented by epitaxy. In this text, "deposition" or "growth" is thus understood to refer to the formation of a monocrystalline layer by epitaxy.

It is specified that the invention applies to all types of epitaxy, such as molecular beam epitaxy (MBE), organometallic vapor phase epitaxy (OMVPE), or even LPCVD (Low Pressure Chemical Vapor Deposition (LPCVD) or HVPE (Hydride Vapor Phase Epitaxy), which are well known to the person skilled in the art.

Substrate 1 is in a monocrystalline material likely to cause tensile stresses in the GaN layer, such as, for example, silicon, diamond or silicon carbide.

On this substrate 1, a nucleation layer 2 is formed in a material whose lattice parameter is intermediate between that of the substrate and that of GaN. In a particularly advantageous manner, the nucleation layer is in AlN whose thickness is on the order of 40 nm. Due to the lattice parameter mismatch with the material of the substrate, this layer does not present great crystalline quality.

A monocrystalline layer 3, so-called "intermediate layer", is then grown on nucleation layer 2.

A monocrystalline seed layer 4 is then grown on intermediate layer 3. The material of the seed layer is typically AlN.

Lastly, the monocrystalline gallium nitride layer 5 is grown, with a thickness that may vary from 100 nm to 7 micrometers and preferably from 800 nm to 7 micrometers.

During these various growth steps, the structure may remain in the same epitaxy support, in which the parameters (nature of the species, temperature) are modified according to the material to grow. Nevertheless, it is possible to proceed with epitaxies of different materials in several pieces of equipment, as needed.

It is possible to form the nucleation layer 2 by the deposition of several layers of different materials. It is thus advantageous for example to form a layer that comprises a gradual composition to enable development of the lattice parameter between the lattice parameter of the support and that of the overlying intermediate layer 3. This allows a lower lattice mismatch with the intermediate layer 3 material that may be thicker and may thus have better crystalline quality.

The intermediate layer 3 material typically is a ternary alloy AlGaN, that enables compression of the seed layer 4 to be induced, in which the proportion of aluminum is between 1 and 35%, preferably greater than 6% and/or less than 30%.

The preferred maximum aluminum content in the AlGaN intermediate layer 3 is chosen from a compromise between the desired crystalline homogeneity of the material (i.e., aluminum and gallium contents that are identical in every point) and its deposition temperature ensuring a good crystallinity.

In fact, the higher the aluminum content of the intermediate layer 3, the higher the deposition temperature should be (compared to the deposition temperature of a layer of GaN without aluminum) and closer to the deposition temperature of the AlN, which is a very refractory material (the temperature generally used for AlN deposition is on the order of 1350° C.).

But the presence of the gallium element, which is very volatile, does not allow temperatures that high to be reached without risking evaporation thereof.

Thus, to maintain sufficient crystalline homogeneity and a deposition temperature suitable for good crystallinity, the aluminum content preferably is less than 35%. To obtain very good crystalline quality, the aluminum content should be of about 20% in the contemporary state of art.

The thickness of the intermediate layer 3 is preferably greater than 250 nm.

With a substrate 1 of silicon, a nucleation layer 2 of AlN, the thickness of the intermediate layer 3 of AlGaN may reach 600 nm. On the other hand, beyond a thickness of 600 nm, the stress imposed by the difference in CTE between substrate 1 and intermediate layer 3 is such that it risks generating cracking of the intermediate layer when cooling the structure.

With a substrate 1 in SiC that induces less stress in the intermediate layer 3 of AlGaN and with a nucleation layer 2 in AlN, the layer 3 may reach 2 micrometers without generating cracks.

The effects of the intermediate layer 3 of AlGaN are multiple.

First, its lattice parameter is close—closer than the lattice parameter of GaN used in the prior art—to that of the AlN of the underlying nucleation layer 2 and of the AlN of the overlying seed layer 4. This slight difference in lattice parameter allows the quantity of dislocations in this layer to be reduced.

In addition, the presence of aluminum reinforces the intermediate layer 3, in particular when the aluminum content is greater than 6%, which better resists the backstress imposed by the AlN seed layer 4 than GaN. In fact, GaN is fragile at high temperatures and tends to break down by exodiffusion of the gallium under the effect of the stress imposed by the overlying AlN.

The consequence of the previous point is that one may increase the deposition temperature of the seed layer 4 without degrading the intermediate layer 3, which allows a better crystalline quality of the material of the seed layer 4 to be obtained. The deposition temperature of this seed layer 4 is all the same limited by the temperature at which the substrate degrades. In the case of silicon, the temperature limit is on or about 1300° C.

Lastly, when the thickness of the intermediate layer 3 is more than 250 nm, the layer allows better crystalline quality at the surface on which the seed layer 4 will be deposited, since it allows the dislocations to meet and cancel each other out. The result is a smoother AlGaN/AlN interface that promotes pseudomorphic growth of the AlN. The probability of 3D growth (that is, in the form of islands), synonymous with relaxation, is reduced with relation to a rough interface that offers more liberty to the atoms to rearrange themselves and form a relaxed crystal.

Inversely, an intermediate layer 3 thickness of less than 250 nm does not allow sufficient crystallinity to be reached to obtain a smooth interface, which leads to a high degree of defectiveness in the material of the seed layer 4.

Layers 3 and 4 must respect a ratio between the thickness of the seed layer 4 and the thickness of the intermediate layer 3 of between 0.05 and 1, preferably between 0.2 and 0.35.

This thickness ratio of the layers is necessary to maintain good stress in seed layer 4. In fact, one may easily understand that the intermediate layer 3 must have a thickness that matches that of seed layer 4 to impose a stress therein.

The thickness of seed layer 4 is preferably between 30 and 250 nm.

In addition, the deposition temperature of the AlN seed layer 4 is 50 to 150° C. higher than the deposition temperature of the overlying GaN layer 5. Typically, the AlN will be deposited at a temperature on the order of 920° C. while the GaN will be deposited at approximately 800° C.

By MBE, GaN is conventionally deposited between 750 and 830° C. and AlN is formed at a 80 to 150° C. higher temperature. But below a difference of 80° C., the relaxation rate in the seed layer is less satisfactory.

By OMVPE, the AlN will be, for example, deposited at a temperature of between 1050 and 1200° C., and the GaN between 950 and 1100° C. By this technique, the difference in deposition temperature may be reduced up to 50° C. to obtain the desired effect on the stress generated in the layer 5 of GaN.

As explained above, one may implement the growth of the seed layer 4 at a temperature that is so high since the underlying intermediate layer 3 is in a material that better resists temperature.

However, the lower the aluminum content of the layer 3 in AlGaN, for example 8%, the lower its thermal resistance and the more a significant difference between the deposition temperature of layer 4 and that of layer 5 in GaN may cause a dissociation of the AlGaN material. In this case, maintaining a difference of less than 120° C. will be preferred.

These particular conditions of the method present several advantages.

First, the high deposition temperature of the seed layer 4 improves its crystallinity.

In addition, by depositing the GaN of the thick layer 5 at a temperature that is less than the growth temperature of seed layer 4, the lattice parameter of the seed layer is compressed. This smaller lattice parameter of the AlN layer enables a larger compressive stress in the thick layer 5 of GaN than if the two materials were deposited at the same temperature.

The result is that the AlN seed layer presents a relaxation rate at ambient temperature of less than 80%, preferably between 50 and 75%. Relaxation rate is understood to refer to the ratio between the lattice parameter of compressed AlN and the lattice parameter of AlN in the relaxed state. It is specified that compression takes place along a plane (x, y) parallel to the surface of the layer.

Compared to the method from the prior art, the seed layer 4 is thus more in compression. However, the use of an intermediate layer 3 in AlGaN allows a seed layer 4 with very good crystalline quality to be obtained, which enables the overlying layer of gallium nitride to be compressed by limiting relaxation at the interface.

The result is an even greater compressive stress in the layer 5 of GaN, which enables the thickness of this layer to be increased without forming cracks or leading to curvature in the structure that has returned to ambient temperature.

It is specified that if obtaining an AlN seed layer presenting a relaxation rate of less than 80% is an essential condition for producing the invention, the invention is not limited to the particular method described previously to obtain such a layer. One may thus imagine, without departing from the scope of the invention, the use of an intermediate layer in a material other than that of AlGaN, with deposition conditions determined to generate in the overlying seed layer a relaxation rate of less than 80%.

As the curvature of the final structure was directly linked to the residual stress in thick layer 5 at ambient temperature, the invention, which enables the tensile stress imposed on the GaN by the substrate to be offset, thus reduces the stress and bow of the structure. The invention particularly allows curvatures of less than 30 micrometers and preferably less than 10 micrometers on diameters of 4 or 6 inches.

In addition, the invention is not limited to the manufacturing of a layer of gallium nitride, but also more generally applies to the manufacturing of a layer of gallium and aluminum nitride.

It is thus possible to incorporate up to 30% aluminum in layer 5 of GaN while conserving the same parametric processes for the manufacturing of the layer.

The composition of layer 5 may then be formulated by the expression $Al_xGa_{1-x}N$ with x between 0 and 0.3.

The growth of a layer 5 of GaN comprising 20% aluminum is for example achieved with a thickness of 3 micrometers, without cracking and with a temperature of 800° C.

In addition, it is also possible to incorporate up to 10% boron at the AlN seed layer 4 (the seed layer 4 then has a composition expressed by the formula $Al_{1-x}B_xN$ with x between 0 and 0.1) while conserving the properties and effects of this layer that are necessary to the invention.

For example, as the lattice parameter of the BN material is less than that of the AlN, layer 4 comprising 10% of B (or x=0.1), and deposited on intermediate layer 3 in AlGaN further compresses the GaN of layer 5.

As the BN material is a very refractory material like AlN, $Al_{1-x}B_xN$ may be deposited with very good crystallinity at high temperature, while allowing the same difference with the deposition temperature of the layer 5 of GaN.

Obtaining, thanks to the use of an intermediate layer containing aluminum, a higher compressive stress in the AlN seed layer seems to be explained by the presence, in the crystalline structures of the materials, of coherence planes. These coherence planes correspond to multiples or harmonics of lattice parameters of materials on both sides of the considered interface.

The stress is not applied at the level of each lattice but is distributed between two adjacent coherence planes.

Compared to GaN, AlGaN, which presents a lower lattice parameter, would allow the lattice parameter of the AlN of the overlying seed layer 4 to be compressed by different coherence planes.

In fact, there would not be a simple lattice match at the interface between the intermediate layer 3 and the seed layer 4, but a match between two coherence planes, multiples of lattice parameters on both sides of the interface.

For example, in the relaxed state, the lattice parameter of the intermediate layer 3 in GaN is 3.185 Å, while the lattice parameter of the seed layer 4 in AlN is 3.11 Å.

Consequently, by supposing that there were, on both sides of the interface, 97 crystal lattices of GaN and 100 crystal lattices of AlN between two coherence planes, a residual stress of 2 Å remains that is distributed between all the AlN lattices, which are thus very slightly compressed.

With an intermediate layer 3 in AlGaN, the coherence planes are such that the residual stress that is applied at each AlN lattice of seed layer 4 is markedly larger, that is, greater than 20%.

Experimental Results

A layer of GaN can grow by at least 3 μm in thickness without cracking and the final structure after deposition presents a bow of approximately 6 micrometers, on diameters of 4 and 6 inches, with a level of dislocations in the GaN of less than $5 \cdot 10^9$ cm$^{-2}$.

These results are obtained by implementing the method described below.

On a silicon substrate 1, an AlN nucleation layer 2 is deposited at 900° C. and over a thickness of 40 nm.

Then an intermediate layer 3 of AlGaN comprising 8% aluminum is deposited over a thickness of 300 nm at 800° C.

The AlN seed layer 4 is deposited at 920° C. until a layer of 180 nm is obtained. This layer typically has a relaxation rate of 70% at ambient temperature.

A thick layer 5 of 5 micrometers of GaN is then deposited at 780° C., at a growth rate of 1 μm/h, without cracking.

According to a variation, the intermediate layer 3 of AlGaN may also present a thickness of 500 nm with an aluminum content of 15%, while the AlN seed layer 4 presents a thickness of 150 nm to maintain a very good stress in seed layer 4.

The person skilled in the art may also carry out a temperature ramp during deposition of the AlN seed layer 4 in order to reach 920° C. following deposition of the intermediate layer 3 of AlGaN at 800° C.

Application to the Manufacturing of an Electronic Device

The invention may advantageously be applied to the manufacturing of electronic or electroluminescent devices or devices operating at high frequencies or high power, such as photovoltaic components, electroluminescent diodes, Schottky diodes, lasers, optical detectors, MEMS, HEMT type field effect transistors or for example a rectifier or a MOS transistor.

Figure 3:
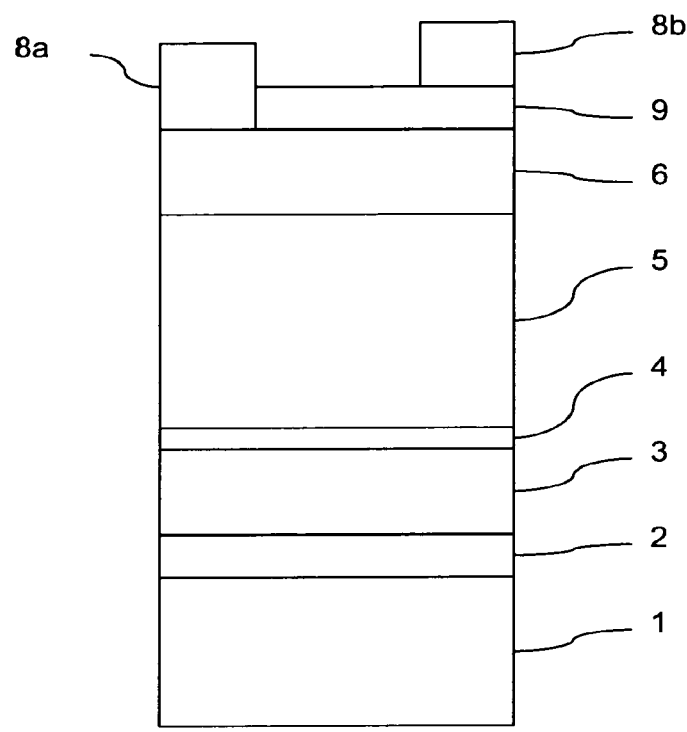
FIG. 3 represents an electronic device constructed from the structure of the invention.

With reference to FIG. 3, a field effect transistor is typically formed from the layer 5 of GaN—on the structure on which it was epitaxied—, the GaN layer 5 being covered by a barrier layer 6, for example in AlGaN.

The interface between GaN layer 5 and AlGaN layer 6 constitutes a heterojunction where the GaN has a forbidden band of less than that of the AlGaN.

The upper part of the GaN layer 5, under the interface, delimits a channel (not represented) in which a two-dimensional gas of electrons may circulate.

Now, a second heterojunction exists in the structure of this device, that is, the heterojunction between the intermediate layer 3 and the seed layer 4.

This second heterojunction constitutes a potential well likely to confine the electrons, potentially creating a capacitive effect.

In this electronic device, the fact that the intermediate layer 3 is in AlGaN—and not in GaN as in the prior art cited in the introduction—allows the size of this second heterojunction to be reduced, and thus limits the potential capacitive effect.

In the case of an HEMT type transistor (illustrated in FIG. 3), the electronic device also comprises at least one ohmic contact electrode 8a and one Schottky contact electrode 8b, the ohmic contact electrode 8a preferably being deposited on the barrier layer 6 while the Schottky contact electrode is deposited on a superficial layer 9 formed on the barrier layer. The ohmic contact electrodes number two and are named source and drain electrodes.

According to a first example of formation of such a transistor, an intermediate layer 3 in AlGaN with an aluminum content of 20%, and a seed layer 4 of 800 Å thickness with a relaxation rate of 65% are formed on an SiC substrate.

The GaN layer 5 is then deposited without formation of cracks over a thickness of 1.5 micrometers in view of forming an HEMT transistor.

Figure 4:
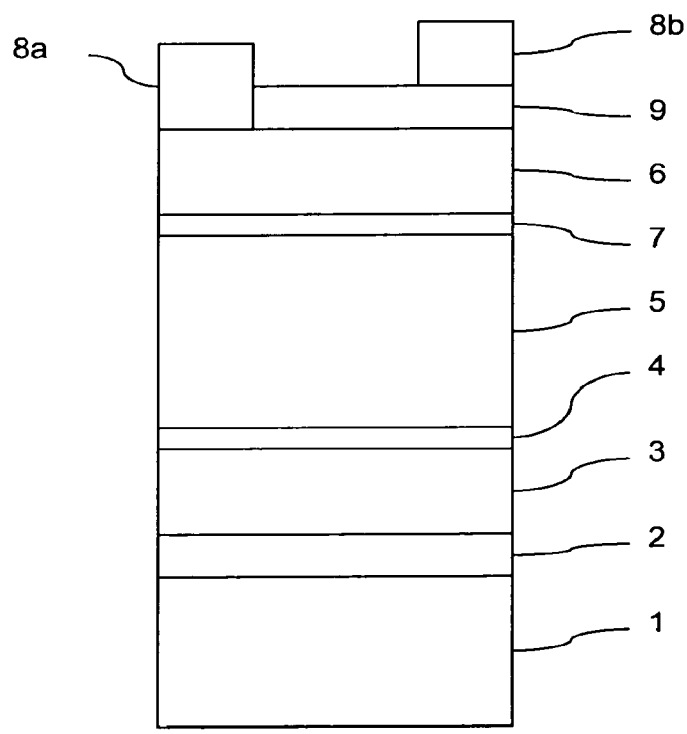
FIG. 4 illustrates another configuration of the electronic device in conformance with the invention.

According to a variation, illustrated in FIG. 4, the invention may be applied to a field effect transistor wherein the materials of the structure present a different composition from those of the structure described above.

For example, layer 5 is in AlGaN with 3 to 5% aluminum and presents a thickness of between 1.8 and 2.2 microns.

A channel layer 7 of GaN with a thickness of between 5 and 100 nm for example is then inserted between layer 5 and a barrier layer 6 in AlGaN, and the forbidden band difference between the GaN of channel layer 7 and the AlGaN of the barrier layer 6 enables the formation of a potential well at the heterojunction, in which a two-dimensional gas of electrons may circulate.

The barrier layer 6 advantageously comprises from 20 to 70% aluminum and presents a thickness of 5 to 30 nm.

When the aluminum content in the barrier layer 6 becomes high (for example, beyond 30%), it becomes difficult to control the homogeneity of the aluminum in the layer.

The barrier layer 6 is then advantageously formed by alternating thin layers of aluminum nitride (which may contain a low gallium content) and thin layers of gallium nitride (which may contain a low aluminum content) until the desired thickness and group III element contents are reached. This type of alternating or stacking of thin layers is known to the person skilled in the art by the name "superalloy" or "superlattice".

Alternately, it is also advantageous to make a barrier layer 6 in AlInN on a previously described structure, either directly on layer 5, if it is in GaN, or on the channel layer 7 formed previously on layer 5, if the latter contains aluminum.

In fact, the AlInN material presents a very large band gap. It thus promotes deep wells at the heterojunction with the GaN and the layer 5 or, where appropriate, with the channel layer 7.

Furthermore, this material presents a "spontaneous" piezoelectric field, much larger than the AlGaN.

This spontaneous piezoelectric field, which depends on the nature of the material, participates in the total piezoelectric field of the structure, with the piezoelectric field "induced" by the stress in the barrier material.

Thus, as the spontaneous piezoelectric field of AlInN is large, it is not necessary to constrain the material to increase the total piezoelectric field. It may be deposited in the relaxed state and have the same effect as a barrier 6 in AlGaN stress, on the density of the electron gas. Growth in the relaxed state allows the formation of crystal defects to be limited, promotes a quality crystalline interface and prevents the formation of leakage current.

Another advantage of depositing AlInN on the GaN layer 5 or, where appropriate, on the GaN channel layer 7, resides in that, depending on the indium content in AlInN, this material may be lattice matched with GaN. For example, AlInN comprising 18% indium has the lattice parameter of relaxed GaN. When the GaN is in compression on layer 3 in AlGaN, its lattice parameter is reduced, consequently, it is easy to reduce the indium content of the AlInN to conserve the lattice matching.

Another advantage resides in that the AlInN material may easily be prepared with a high level of n type doping. The material may then be used to reserve electrons and increase the density of the two-dimensional electron gas.

Preferably, a field effect transistor will be manufactured from a barrier 6 of AlInN comprising from 5 to 25% indium. This layer may be formed by a superalloy.

It is also possible to form a barrier layer 6 in BGaN comprising for example 15 to 30% boron on a layer 5 in GaN or, where appropriate, on the channel layer 7 in GaN. The advantage of this material is that the lattice parameter of the BN is less than that of the AlN and the GaN so that the material of the barrier layer 6 is further compressed.

Consequently, as the stress in the barrier layer is larger, the induced piezoelectric field is also larger and the electron gas is denser.

The thickness of the barrier layer 6 may then be thinned while allowing an induced piezoelectric field that is identical to that procured by AlGaN on GaN with a standard thickness. The distance between the surface of the structure and the electron channel is lower and the electron gas control is improved.

Another alternative consists of depositing a channel layer 7 in ScN on layer 5 of $Al_xGa_{1-x}N$. This binary material is formed more easily than the ternary materials, which allows very good crystalline quality and homogeneous material to be obtained. Its lattice parameter is very close to that of GaN (a lattice mismatch of less than 0.1%), its growth on a layer 5 in GaN limits the formation of crystal defects and enables a good crystalline interface.

This interface is all the more improved as the materials of layers 5 and 7 are binary, the diffusion of elements is limited and the field is homogeneous. This effect is further improved if a spacer layer in a binary material is inserted between the channel layer 7 and the barrier 6, for example in AlN.

When the layer 5 contains aluminum, the ScN material of layer 7 is constrained, because of the lattice parameter difference, which increases the mobility of the two-dimensional gas electrons.

The band gap of this material is 2.3 eV, making it particularly suitable for fields generated at the GaN/ScN and ScN/AlGaN interfaces.

The thickness of this channel 7 may be from 5 to 100 nm and the material of the barrier 6 is chosen to obtain a suitable heterojunction. This material is, for example, AlGaN, BGaN and AlInN.

What is claimed is:

1. A structure comprising a crack-free monocrystalline nitride layer having the composition $AlxGa_{1-x}N$, where $0 \leq x \leq 0.3$, and a substrate that is likely to generate tensile stress in the nitride layer, the structure successively comprising:
   the substrate;
   a nucleation layer;
   a monocrystalline intermediate layer having a selected thickness on the nucleation layer;
   a monocrystalline seed layer of an AlBN compound in which the boron content is between 0 and 10% having a selected thickness on the intermediate layer and a relaxation rate, at ambient temperature, of less than 80%; and
   the monocrystalline nitride layer.

2. The structure according to claim 1, wherein the seed and intermediate layers are present at a thickness ratio of between 0.05 and 1.

3. The structure according to claim 1, wherein the seed and intermediate layers are present at a thickness ratio of between 0.2 and 0.35.

4. The structure according to claim 1, wherein the monocrystalline nitride layer has a thickness of between 800 nm and 7 micrometers.

5. The structure according to claim 1, wherein the intermediate layer is aluminum or gallium nitride.

6. The structure according to claim 1, wherein the intermediate layer is aluminum nitride having an aluminum content of between 1 and 35%.

7. The structure according to claim 1, wherein the intermediate layer has a thickness that is equal to or greater than 250 nm.

8. The structure according to claim 1, wherein the seed layer has a thickness of between 30 and 250 nm.

9. The structure according to claim 1, wherein the seed layer has a relaxation rate at ambient temperature of between 50 and 75%.

10. The structure according to claim 1, wherein the monocrystalline nitride layer comprises 3 to 5% of aluminum and wherein the structure further successively comprises, on the monocrystallilne nitride layer:
  a gallium nitride channel layer; and
  a barrier layer of AlGaN, AlInN or BGaN.

11. The structure according to claim 10, wherein the gallium nitride channel layer has a thickness of 5 to 100 nm.

12. The structure according to claim 1, wherein the structure further successively comprises, on the monocrystalline nitride layer:
  a channel layer of ScN; and
  a barrier layer of AlGaN, AlInN or BGaN.

13. The structure according to claim 1, wherein the monocrystalline nitride layer is gallium nitride and wherein the structure further comprises, on the gallium nitride layer, a barrier layer of AlGaN, AlInN or BGaN.

14. A device comprising the structure of claim 1 and provided in the form of a photovoltaic component, an electroluminescent diode, a Schottky diode, a laser, an optical detector, or an MEMS.

15. A field effect transistor comprising the structure of claim 1.

* * * * *

UNITED STATES PATENT AND TRADEMARK OFFICE
CERTIFICATE OF CORRECTION

| | | |
|---|---|---|
| PATENT NO. | : 8,283,673 B2 | Page 1 of 1 |
| APPLICATION NO. | : 13/313522 | |
| DATED | : October 9, 2012 | |
| INVENTOR(S) | : Lahreche | |

It is certified that error appears in the above-identified patent and that said Letters Patent is hereby corrected as shown below:

Title Page:

Item (57) ABSTRACT, at line 3 change "$0 \leqq x \leqq 0.3$" to -- $0 \leq x \leq 0.3$ --.

Column 10:

Line 34 (claim 1, line 3), change "$0 \leqq x \leqq 0.3$" to -- $0 \leq x \leq 0.3$ --.

Signed and Sealed this
First Day of January, 2013

David J. Kappos
*Director of the United States Patent and Trademark Office*